(12) United States Patent
Harada et al.

(10) Patent No.: US 7,345,421 B2
(45) Date of Patent: Mar. 18, 2008

(54) ORGANIC ELECTROLUMINESCENT DEVICE HAVING A HIGH PH ADHESIVE LAYER

(75) Inventors: Gaku Harada, Hirakata (JP); Hisao Haku, Neyagawa (JP)

(73) Assignee: Sanyo Electric Co., Ltd., Osaka (JP)

( * ) Notice: Subject to any disclaimer, the term of this patent is extended or adjusted under 35 U.S.C. 154(b) by 456 days.

(21) Appl. No.: 10/953,061

(22) Filed: Sep. 30, 2004

(65) Prior Publication Data
US 2005/0093439 A1    May 5, 2005

(30) Foreign Application Priority Data
Sep. 30, 2003  (JP) ............................. 2003-342649
Sep. 28, 2004  (JP) ............................. 2004-280863

(51) Int. Cl.
*H01J 1/62*    (2006.01)
(52) U.S. Cl. ...................................... 313/506; 313/509
(58) Field of Classification Search ......... 313/498–512
See application file for complete search history.

(56) References Cited

U.S. PATENT DOCUMENTS

| 5,909,081 A | * | 6/1999 | Eida et al. .................. 313/504 |
| 6,097,100 A | | 8/2000 | Eguchi et al. |
| 2003/0015691 A1 | * | 1/2003 | Haghighat et al. .......... 252/500 |

FOREIGN PATENT DOCUMENTS

| JP | 5-182759 | 7/1993 |
| JP | 10-114853 A | 5/1998 |
| JP | 2002-231443 | 8/2002 |
| JP | 2003-257615 A | 9/2003 |

OTHER PUBLICATIONS

Japanese Office Action in corresponding Japanese Patent Application No. JP 2004, dated Sep. 26, 2006.

* cited by examiner

*Primary Examiner*—Joseph Williams
*Assistant Examiner*—Bumsuk Won
(74) *Attorney, Agent, or Firm*—McDermott Will & Emery LLP

(57) ABSTRACT

First, a plurality of organic EL elements are formed on a substrate. The electron injection electrode of an organic EL element has a stacked layer structure of a metal thin film and a metal oxide film. A sealing agent is provided on the upper portion and outer periphery of the plurality of organic EL elements on the substrate, so as to surround the entire perimeter of the plurality of organic EL elements. A sealing plate is bonded to the upper face side of the sealing agent with a color filter sandwiched therebetween. As the sealing agent, a resin adhesive is used from which a solution extracted in accordance with the SEMI standard G29-1296 after curing has a pH of not less than four nor more than ten. It is preferable that the resin adhesive has a light transmittance of 70% or more on average in the wavelength range of 450 nm to 800 nm, with the variation range of the light transmittance in the wavelength range of 450 nm to 800 nm being not more than ±10% for the average light transmittance.

17 Claims, 4 Drawing Sheets

(a)

(b)

ORGANIC ELECTROLUMINESCENT DEVICE HAVING A HIGH PH ADHESIVE LAYER

BACKGROUND OF THE INVENTION

1. Field of the Invention

The present invention relates to an organic electroluminescent device and the fabrication method thereof.

2. Description of the Background Art

In recent years, with increasing diversity in information equipment, there is a growing need for flat panel display elements requiring smaller power consumption than generally used CRTs (Cathode Ray Tube). As one of the flat panel display elements, an organic electroluminescent (hereinafter abbreviated as an organic EL) element having such features as high efficiency, thin-type, light weight, and low dependence of angular-field-of-view is calling attention, with displays using these organic EL elements being under active development.

An organic EL element is a self light emitting element, in which electrons and holes are injected into a light emitting portion from an electron injection electrode and a hole injection electrode, respectively, and the injected electrons and holes are recombined at the light emitting center to bring an organic molecule into an excited state, so that the organic molecule emits fluorescent light when returning to a ground state from the excited state.

An emission color of the organic EL element can be varied by the choice of a fluorescent substance as a luminescent material, and therefore, the organic EL element is expected to find applications in such displays as multi-color and full-color displays. The organic EL element can also serve as a backlight for a liquid crystal display and the like because of the capability of surface-light emission at low voltage. Such organic EL elements are currently in the development stage for applications in small displays used in digital cameras, portable telephones, and the like.

The organic EL element is very sensitive to moisture: specifically, phenomena occur, such as the deterioration of the interface between a metal electrode and an organic layer affected by moisture, the stripping of electrodes, an increase in resistance of the metal electrode resulting from oxidation, or the deterioration of an organic material itself due to moisture. This causes increased drive voltage, the formation and growth of dark spots (non-luminescent defects), reduced luminance, or the like, resulting in the problem of the loss of sufficient reliability.

The organic EL element therefore cannot maintain sufficient reliability, unless the invasion of moisture thereto is prevented. For this reason, the structure as shown in FIG. 4 is used in order to prevent the invasion of moisture. FIG. 4 is a schematic cross-section of a conventional organic EL device.

In FIG. 4, a plurality of organic EL elements 50 are provided on a substrate 1. Each of the organic EL elements 50 includes, in sequence, a hole injection electrode, a hole injection layer, a hole transport layer, a light emitting layer, an electron transport layer, an electron injection layer, and an electron injection electrode. Only the hole injection electrode 2 is shown herein.

In the conventional organic EL device, a sealing agent 11 is applied to the outer periphery of the substrate 1, and a sealing can 20J made of a glass or a metal with a desiccant 31 inside is put above the substrate 1 so as to cover the plurality of organic EL elements 50. The sealing agent 11 is allowed to cure using ultraviolet light or heat, which bonds the sealing can 20J made of a metal or a glass to the substrate 1. The organic EL elements 50 are thus shielded from the outside-air.

In the organic EL device 900 of FIG. 4, the sealing can 20J is used for sealing off the organic EL elements 50. Here, the desiccant 31 is provided inside the sealing can 20J. In such a structure, the hole injection electrode 2, being in contact with the sealing agent 11, will undergo corrosion with an elapse of time due to the invasion of moisture into the sealing agent 11.

For this reason, a structure of an organic EL element has been proposed in which a photo-cured resin layer having moisture resistance is formed to cover the organic EL layers of the organic EL element, on top of which is fixed a small substrate having non-water permeability (refer to, for example JP 5-182759 A).

With this organic EL element structure, thinning of the organic EL element itself has been achieved, because the organic EL element is shielded from the outside-air using the moisture-resistant photo-cured resin layer and the non-water permeable substrate.

Also proposed is a structure of a display in which a lower electrode, a light emitting layer, and an upper electrode are formed in sequence on the substrate, on top of which is formed, in contact with the upper electrode, a sealing film made of a material having a refractive index less than 3.5 and higher than the refractive index of the atmosphere (refer to, for example, JP 2002-231443 A).

With this display structure, an improved efficiency of extracting the light emitted from the light emitting element through the upper electrode side has been achieved, because of reduced reflection of the emitted light on the surface of the upper electrode.

In the structures of the above-described patent documents 1 and 2, however, as the standing time for testing moisture resistance elapses, phenomena occur in the organic EL element and the display, such as decreased luminance, the formation of dark spots, or the expansion and advance thereof. As a result, the organic EL element undergoes further deterioration, which ultimately makes it impossible for use.

SUMMARY OF THE INVENTION

It is an object of the present invention to provide a long-life organic electroluminescent device and the fabrication method thereof, where the deterioration with time of the organic electroluminescent device can be suppressed to a minimum, with its initial performance being maintained for a long period of time.

An organic electroluminescent device according to one aspect of the present invention comprises: a substrate; one or more organic electroluminescent elements provided on the substrate; and an adhesive layer composed of an adhesive that is provided on the one or more organic electroluminescent elements, wherein each of the one or more organic electroluminescent elements includes a first electrode, a light emitting layer, and a second electrode in this order on the substrate, the second electrode has a stacked layer structure of a metal oxide film and a metal film having a smaller thickness than that of the metal oxide film, and a solution extracted from the adhesive of the adhesive layer has a pH of not less than four.

In the organic electroluminescent device, the second electrode of the one or more organic electroluminescent elements has the stacked layer structure of the metal oxide film and the metal film with a smaller thickness. The metal oxide film has good optical transparency, the metal film has good electrical conductivity. Thus, the second electrode has good optical transparency and electrical conductivity. This allows the light emitted from the light emitting layer to be extracted out of the device through the second electrode.

Moreover, the one or more organic electroluminescent elements on the substrate are sealed off with the adhesive layer composed of the adhesive from which the extracted solution has a pH not less than four. This prevents the formation of an acid solution, even if ions eluted from the adhesive are dissolved in the moisture invaded from the outside. Accordingly, the deterioration of the electrodes and the organic materials due to an acid solution will not occur, even if moisture enters each of the organic electroluminescent elements from the outside through defects in the thin metal film. As a result, the deterioration with time of the organic electroluminescent device is suppressed, so that the organic electroluminescent device can maintain its initial performance for a long period of time, leading to a longer life.

The metal film of the second electrode may have a thickness not less than 1 nm nor more than 20 nm. In this case, the metal film has a sufficient electrical conductivity while being optically transparent.

It is preferable that the adhesive layer has a light transmittance of not less than 70% on average in the wavelength range of 450 nm to 800 nm.

In this case, most of the light emission in the visible light range can be extracted out of the device through the adhesive layer, so that a decrease in the luminous efficiency of the organic electroluminescent device can be suppressed.

It is preferable that the variation range of the light transmittance of the adhesive layer in the wavelength range of 450 nm to 800 nm is not more than ±10% for the average light transmittance.

In this case, the adhesive layer would not be colored, being almost transparent and colorless. This allows the light emitted from the organic electroluminescent element to be extracted out of the device with a high efficiency.

It is more preferable that the variation range of the light transmittance of the adhesive layer in the wavelength range of 450 nm to 800 nm is not more than ±5% for the average light transmittance.

In this case, the adhesive layer would not be colored, being almost completely transparent and colorless. This allows the light emitted from the organic electroluminescent element to be extracted out of the device with a higher efficiency.

The organic electroluminescent device may further comprise an optically transparent sealing plate that is provided on the adhesive layer.

In this case, the light emitted from the one or more organic electroluminescent elements is extracted out of the device through the optically transparent sealing plate. This results in the organic electroluminescent device of the top emission structure. Moreover, the one or more organic electroluminescent elements on the substrate are provided with the sealing plate through the adhesive layer, so that the deterioration with time of the one or more organic electroluminescent elements is sufficiently suppressed, while the thinner organic electroluminescent device as compared with an organic electroluminescent device sealed in a sealing can is achieved.

The sealing plate may be composed of a glass. In this case, the light emitted from the one or more organic electroluminescent elements on the substrate is sufficiently extracted out of the device through the sealing plate.

The organic electroluminescent device may further comprise a color conversion member that is provided on the sealing plate. In this case, the light emitted from the one or more organic electroluminescent elements on the substrate is extracted out of the device through the color conversion member and the sealing plate. This results in the organic electroluminescent device of the top emission structure which emits in a desired color.

Each of the one or more organic electroluminescent elements may further comprise a passivation layer that is provided on the second electrode.

In this case, the invasion of moisture from the outside through defects in the thin metal film is prevented. This sufficiently suppresses the deterioration with time of the organic electroluminescent device.

The substrate may be either a passive type substrate or an active matrix type substrate having a plurality of thin film transistors. In this case, the deterioration with time of the passive type or the active matrix type substrate is suppressed.

A filler may be added to the adhesive layer. In this case, the adhesive layer has improved moisture resistance. This sufficiently prevents the invasion of moisture into the organic electroluminescent device.

An organic electroluminescent device according to another aspect of the present invention comprises: a substrate; one or more organic electroluminescent elements provided on the substrate; an adhesive layer composed of an adhesive that is provided on the one or more organic electroluminescent elements; and an optically transparent sealing plate that is provided on the adhesive layer, wherein each of the one or more organic electroluminescent elements includes a first electrode, a light emitting layer, and an optically transparent second electrode in this order on the substrate, and a solution extracted from the adhesive of the adhesive layer has a pH of not less than four.

In the organic electroluminescent device, the second electrode and the sealing plate have optical transparency. This allows the light emitted from the light emitting layer of the one or more organic electroluminescent elements to be extracted out of the device through the second electrode and the sealing plate. This results in the organic electroluminescent device of the top emission structure. In this case, the thinner organic electroluminescent device as compared with an organic electroluminescent device sealed in a sealing can is achieved.

Moreover, the one or more organic electroluminescent elements on the substrate are sealed off with the adhesive layer composed of the adhesive from which the extracted solution has a pH not less than four. This prevents the formation of an acid solution, even if ions eluted from the adhesive are dissolved in the moisture invaded from the outside. Accordingly, the deterioration of the electrodes and the organic materials due to an acid solution will not occur, even if moisture enters each of the organic electroluminescent elements from the outside. As a result, the deterioration with time of the organic electroluminescent device is suppressed, so that the organic electroluminescent device can maintain its initial performance for a long period of time, leading to a longer life.

It is preferable that the adhesive layer has a light transmittance of not less than 70% on average in the wavelength range of 450 nm to 800 nm.

In this case, most of the light emission in the visible light range can be extracted out of the device through the adhesive layer, so that a decrease in the luminous efficiency of the organic electroluminescent device can be suppressed.

It is preferable that the variation range of the light transmittance of the adhesive layer in the wavelength range of 450 nm to 800 nm is not more than ±10% for the average light transmittance.

In this case, the adhesive layer would not be colored, being almost transparent and colorless. This allows the light emitted from the organic electroluminescent element to be extracted out of the device with a high efficiency.

It is more preferable that the variation range of the light transmittance of the adhesive layer in the wavelength range of 450 nm to 800 nm is not more than ±5% for the average light transmittance.

In this case, the adhesive layer would not be colored, being almost completely transparent and colorless. This allows the light emitted from the organic electroluminescent element to be extracted out of the device with a higher efficiency.

The sealing plate may be composed of a glass. In this case, the light emitted from the one or more organic electroluminescent elements on the substrate is sufficiently extracted out of the device through the sealing plate.

The organic electroluminescent device may further comprise a color conversion member that is provided on the sealing plate. In this case, the light emitted from the one or more organic electroluminescent elements on the substrate is extracted out of the device through the color conversion member and the sealing plate. This results in the organic electroluminescent device of the top emission structure which emits in a desired color.

A method of fabricating an organic electroluminescent device according to still another aspect of the present invention comprises the steps of: forming one or more organic electroluminescent elements on a substrate; forming an adhesive layer composed of an adhesive on the one or more organic electroluminescent elements; and curing the adhesive layer, wherein the step of forming the one or more organic electroluminescent elements includes the step of forming a first electrode, a light emitting layer, and a second electrode in this order on the substrate, and the second electrode has a stacked layer structure of a metal oxide film, and a metal film having a smaller thickness than that of the metal oxide film, and wherein a solution extracted from the adhesive of the adhesive layer has a pH of not less than four.

In the method of fabricating the organic electroluminescent device, the one or more organic electroluminescent elements are formed on the substrate. In this case, the first electrode, the light emitting layer, and the second electrode are formed in this order on the substrate. On the one or more organic electroluminescent elements is formed the adhesive layer composed of the adhesive, followed by curing of the adhesive layer.

The second electrode of the one or more organic electroluminescent elements has the stacked layer structure of the metal oxide film, and the metal film having a smaller thickness. The metal oxide film has good optical transparency, the metal film has good electrical conductivity. Thus, the second electrode has good optical transparency and electrical conductivity. This allows the light emitted from the light emitting layer to be extracted out of the device through the second electrode.

Moreover, the one or more organic electroluminescent elements on the substrate are sealed off with the adhesive layer composed of the adhesive from which the extracted solution has a pH not less than four. This prevents the formation of an acid solution, even if ions eluted from the adhesive are dissolved in the moisture invaded from the outside. Accordingly, the deterioration of the electrodes and the organic materials due to an acid solution will not occur, even if moisture enters each of the organic electroluminescent elements through defects in the thin metal film from the outside. As a result, the deterioration with time of the organic electroluminescent device is suppressed, so that the organic electroluminescent device can maintain its initial performance for a long period of time, leading to a longer life.

The metal film of the second electrode may have a thickness of not less than 1 nm nor more than 20 nm. In this case, the metal film has a sufficient electrical conductivity while being optically transparent.

A method of fabricating an organic electroluminescent device according to yet another aspect of the present invention comprises the steps of: forming one or more organic electroluminescent elements on a substrate; providing an optically transparent sealing plate on the one or more organic electroluminescent elements through an adhesive layer composed of an adhesive; and curing the adhesive layer, wherein the step of forming the one or more organic electroluminescent elements includes the step of forming a first electrode, a light emitting layer, and a second electrode in this order on the substrate, and a solution extracted from the adhesive of the adhesive layer has a pH of not less than four.

In the method of fabricating the organic electroluminescent device, the one or more organic electroluminescent elements are formed on the substrate. In this case, the first electrode, the light emitting layer, and the second electrode are formed in this order on the substrate. The optically transparent sealing plate is provided on the one or more organic electorluminescent devices through the adhesive layer composed of the adhesive, followed by curing of the adhesive layer.

In the organic electroluminescent device, the second electrode and the sealing plate have optical transparency. This allows the light emitted from the light emitting layer of the one or more organic electroluminescent elements to be extracted but of the device through the second electrode and the sealing plate. This results in the organic electroluminescent device of the top emission structure. In this case, the thinner organic electroluminescent device as compared with an organic electroluminescent device sealed in a sealing can is achieved.

Moreover, the one or more organic electroluminescent elements on the substrate are sealed off with the adhesive layer composed of the adhesive from which the extracted solution has a pH not less than four. This prevents the formation of an acid solution, even if ions eluted from the adhesive are dissolved in the moisture invaded from the outside. Accordingly, the deterioration of the electrodes and the organic materials due to an acid solution will not occur, even if moisture enters each of the organic electroluminescent elements from the outside. As a result, the deterioration with time of the organic electroluminescent device is suppressed, so that the organic electroluminescent device can maintain its initial performance for a long period of time, leading to a longer life.

It is preferable that the adhesive layer has a light transmittance of not less than 70% on average in the wavelength range of 450 nm to 800 nm.

In this case, most of the light emission in the visible light range can be extracted out of the device through the adhesive layer, so that a decrease in the luminous efficiency of the organic electroluminescent device can be suppressed.

It is preferable that the variation range of the light transmittance of the adhesive layer in the wavelength range of 450 nm to 800 nm is not more than ±10% for the average light transmittance.

In this case, the adhesive layer would not be colored, being almost transparent and colorless. This allows the light emitted from the organic electroluminescent element to be extracted out of the device with a high efficiency.

It is more preferable that the variation range of the light transmittance of the adhesive layer in the wavelength range of 450 nm to 800 nm is not more than ±5% for the average light transmittance.

In this case, the adhesive layer would not be colored, being almost completely transparent and colorless. This allows the light emitted from the organic electroluminescent element to be extracted out of the device with a higher efficiency.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following embodiment, an organic electroluminescent (hereinafter abbreviated to an organic EL) device and the fabrication method thereof will be described as an example of the organic electroluminescent device according to the present invention.

Figure 1:
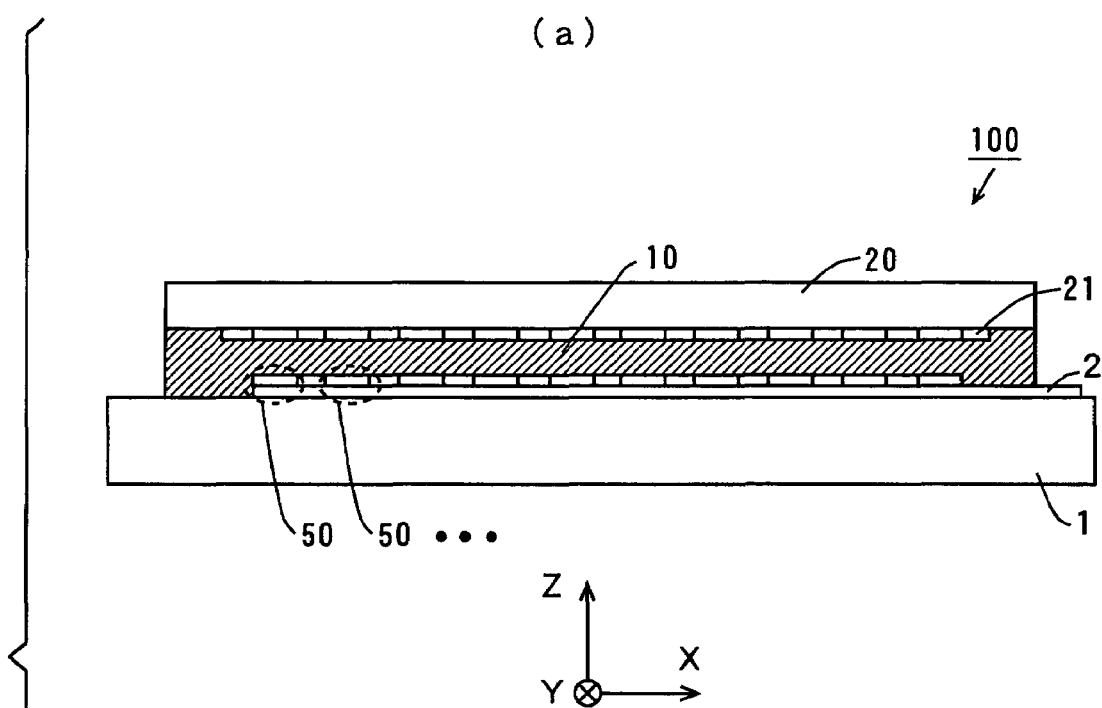
FIG. 1(a) is a schematic cross-section of an organic EL device according to a first embodiment.
FIG. 1(b) is a partly enlarged view of the organic EL device shown in FIG. 1(a)
Figure 1:
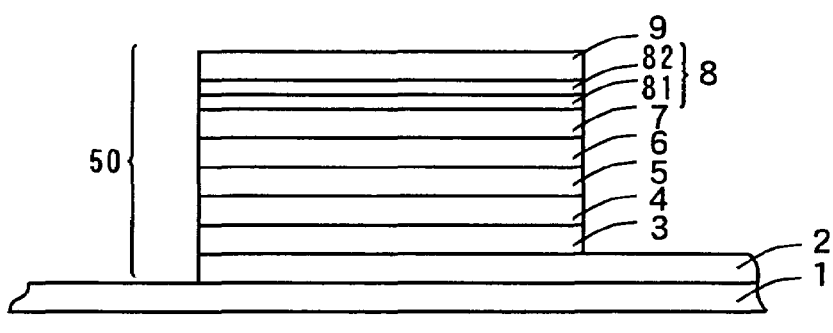

FIG. 1(a) is a schematic cross-section of an organic EL device according to an embodiment, whereas FIG. 1(b) is a partly enlarged view of the organic EL device shown in FIG. 1(a). The organic EL device 100 according to a first embodiment has a top emission structure whereby light is extracted from its top surface side.

In the organic EL device 100 of FIG. 1(a), a plurality of organic EL elements 50 are disposed on a substrate 1 in a matrix form. Each of the organic EL elements 50 constitutes a pixel. For a passive matrix type, a glass substrate is used as the substrate 1, while for an active matrix type, a TFT substrate, in which a plurality of TFTs (Thin Film Transistors) and planarization layers are provided on a glass substrate, is used.

Here, three directions perpendicular to one another are defined as an X-direction, a Y-direction, and a Z-direction. The X- and Y-directions are perpendicular to the surface of the substrate 1, while the Z-direction is vertical to the surface of the substrate 1. The plurality of organic EL elements 50 are disposed along the X- and Y-directions.

As shown in FIG. 1(b), an organic EL element 50 has a stacked layer structure of a hole injection electrode 2, a hole injection layer 3, a hole transport layer 4, a light emitting layer 5, an electron transport layer 6, an electron injection layer 7, an electron injection electrode 8 having a two-layer structure, and a protection film (passivation film) 9.

The hole injection electrode 2 is disposed continuously or for each pixel along the X-direction, while the electron injection electrode 8 is disposed along the Y-direction. The electron injection electrode 8 has a stacked layer structure of a metal thin film 81 and a metal oxide film 82. Adjacent organic EL elements 50 are separated from each other by a device-separating insulating layer composed of a resist material.

The hole injection electrode 2 is a transparent, semi-transparent or opaque electrode composed of a metal compound such as ITO (Indium Tin Oxide), a metal such as Ag (silver) or an alloy. The metal thin film 81 is composed of a metal such as silver (Ag) or gold (Au) or an alloy in a thickness not less than 1 nm nor more than 20 nm, having electrical conductivity. The metal thin film 81 has a smaller thickness than that of the metal oxide film 82. The metal oxide film 82, which is composed of a metal oxide such as IZO (Indium-Zinc oxide) or ITO, is optically transparent. Thus, the electron injection electrode 8 has electrical conductivity and optical transparency.

The hole injection layer 3, hole transport layer 4, light emitting layer 5, electron transport layer 6, and electron injection layer 7 are each composed of an organic material. The electron injection layer 7 is composed of an alkali metal such as lithium (Li), sodium (Na), potassium (K); an alkaline-earth metal such as magnesium (Mg), calcium (Ca), strontium (Sr); or a fluoride thereof, for example. Instead of the light emitting layer 5 and the electron transport layer 6, an electron transporting light emitting layer may be used.

The protection film 9 is composed of an inorganic material such as SiN (silicon nitride), SiO (silicon oxide), SiON, or $Al_2O_3$ (aluminum oxide). Alternatively, the protection film 9 may have a stacked layer structure of an inorganic material and an organic material.

In FIG. 1(a), a sealing agent 10 is provided on the upper portion and outer periphery of the plurality of organic EL elements 50 on the substrate 1, so as to surround the entire perimeter of the plurality of organic EL elements 50. The upper surface of the sealing agent 10 is bonded to a sealing plate 20 with a color filter 21 sandwiched therebetween.

The color filter 21 is formed integrally with the sealing plate 20. The sealing plate 20 and the color filter 21 are each composed of a transparent material such as a glass or plastics. As the color filter 21, a CCM (Color Conversion Medium), as described in JP 2002-299055 A, for example, may be used. As an alternative, both of the transparent material such as a glass or plastics and the CCM may be used as the color filter 21.

In this embodiment, the sealing agent 10 is provided to surround the plurality of organic EL elements 50, as described above.

Application of drive voltage between the hole injection electrode 2 and the electron injection electrode 8 of the organic EL element 50 causes the light emitting layer 5 to emit light. The light emitted from the light emitting layer 5 is extracted out of the device through the electron injection electrode 8, sealing agent 10, color filter 21, and sealing plate 20.

The sealing agent 10 as used in the organic EL device 100 will now be described. As the sealing agent 10 according to this embodiment, a resin adhesive is used from which a solution extracted after photo-curing or heat curing in accordance with the SEMI (Semiconductor Equipment and Material International) standard G29-1296 has a pH of not less than four nor more than ten. A method of the pH measurement for the solution extracted in accordance with the SEMI standard G29-1296 will be described below. The extracted solution as used herein has a pH not less than four nor more than ten, because of the assumption that the organic materials used in the organic EL element 50 will not be dissolved in this solution.

In addition, the sealing agent 10 is composed of a resin, adhesive or the like of an ultraviolet-curing type, visible light-curing type, heat-curing type, complex-curing type using ultraviolet light and heat, or postcuring-type using ultraviolet light.

More specifically, as the sealing agent 10, the following may be used: a thermosetting resin, such as a urea resin, melamine resin, phenol resin, resorcinol resin, epoxy resin, unsaturated polyester resin, polyurethane resin, or acrylic resin; a thermoplastic resin, such as a vinyl acetate resin, ethylene-vinyl acetate copolymer resin, acrylic resin, cyanoacrylate resin, polyvinyl alcohol resin, polyamide resin, polyolefin resin, thermoplastic polyurethane resin, saturated polyester resin, or cellulose resin; a radical photo-curing type adhesive employing a resin including any of a variety of acrylates, such as ester acrylate, urethane acrylate, epoxy acrylate, melamine acrylate or acrylic resin acylate or urethane polyester; alternatively, a cationic photo-curing type adhesive employing a resin such as an epoxy or a vinyl ether; still alternatively, a thiol-en addition-type resin adhesive; yet alternatively, a synthesized polymer adhesive including a rubber, such as a chloroprene rubber, nitrile rubber, styrene-butadiene rubber, natural rubber, butyl rubber or silicone rubber, or a complex resin such as vinyl-phenolic, chloroprene-phenolic, nitrile-phenolic, nylon-phenolic, or epoxy phenolic.

It is preferable that the resin adhesive used as the sealing agent 10 has a light transmittance of 70% or more on average in the wavelength range of 450 nm to 800 nm, with the variation range of the light transmittance in the wavelength range of 450 nm to 800 nm being not more than ±10% for the average light transmittance. It is more preferable that the variation range of the light transmittance in the wavelength range of 450 nm to 800 nm is not more than ±5% for the average light transmittance.

This allows the sealing agent 10 to be sufficiently transparent for the light in the wavelength range of 450 nm to 800 nm without assuming any color. As a result, the light emitted from the light emitting layer 5 can be sufficiently extracted through the sealing agent 10 from the top.

Alternatively, as the sealing agent 10, any of the above materials with the addition of a filler may be used. As an example, the filler added to the sealing agent 10 may be an inorganic material such as SiO (silicon oxide), SiON (silicon oxynitride), SiN (silicon nitride) or a metal material such as Ag, Ni (nickel), Al (aluminum).

Similarly, in the case of the sealing agent 10 with a filler, it is preferable that the sealing agent 10 has a light transmittance of 70% or more on average in the wavelength range of 450 nm to 800 nm, with the variation range of the light transmittance in the wavelength range of 450 nm to 800 nm being not more than ±10% for the average light transmittance. It is more preferable that the variation range of the light transmittance in the wavelength range of 450 nm to 800 nm is not more than ±5% for the average light transmittance.

For the sealing agent 10 with the addition of a filler, the viscosity and moisture resistance are higher as compared with the sealing agent 10 without a filler. The above-described filler may be used as a spacer for making the thickness of the adhesive layer uniform.

In the fabrication of the organic EL device 100 according to this embodiment, the plurality of organic EL elements 50 are first formed on the substrate 1. Then, the side of the substrate 1 with the plurality of organic EL elements 50 and the lower surface of the sealing plate 20 formed integrally with the color filter 21 (i.e., the color filter 21 side) are laminated using the above sealing agent 10. Lastly, by curing the sealing agent 10 between the substrate 1 and the sealing plate 20 in a given curing method, the organic EL device 100 is accomplished.

In the organic electroluminescent device according to this embodiment, the UV-curing type epoxy resin adhesive whose pH is not less than four nor more than ten is used as the sealing agent 10; so that even if ions eluted from the sealing agent 10 are dissolved in the moisture invaded from the outside, an acid solution will not be formed. As a result, it is possible to suppress the deterioration of the hole injection electrode 2, electron injection electrode 8, and organic materials due to an acid solution.

Figure 4:
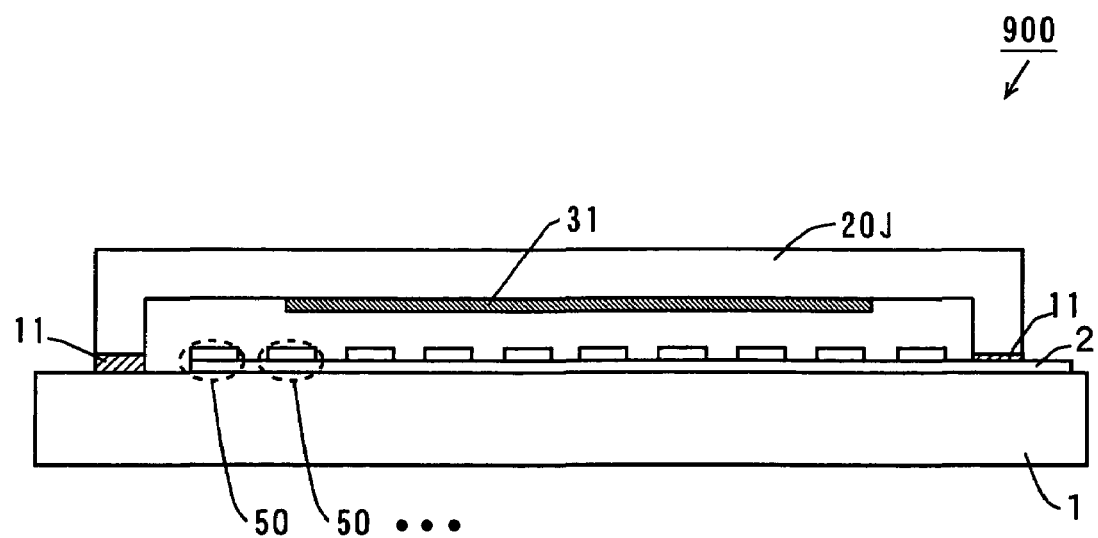
FIG. 4 is a schematic cross-section of a conventional organic EL device.

Moreover, the upper surface of the plurality of organic EL elements 50 formed on the substrate 1 is laminated with the sealing plate 20 through the sealing agent 10; so that the thinner electroluminescent device is achieved as compared with the case of FIG. 4 covered with the sealing can 20J.

Furthermore, the electron injection electrode 8 is composed of the electrically conductive metal thin film 81 and the optically transparent metal oxide film 82; so that the light emitted from the light emitting layer 5 can be efficiently extracted through the electron injection electrode 8 from the top, while the conductivity of the electron injection electrode 8 is ensured.

In this embodiment, the electron injection electrode 8 has a two-layer structure of the metal thin film 81 and the metal oxide film 82, although it may comprise a single-layer film having electrical conductivity and optically tranparency. Alternatively, the electron injection electrode 8 may have a stacked layer structure of three or more layers.

The order of stacking the metal thin film 81 and the metal oxide film 82 is not restricted to that of this embodiment, and the metal thin film 81 may be stacked on top of the metal oxide film 82.

Alternatively, other adhesive may be used to seal off the outer periphery of the sealing agent 10 so as to surround the periphery of the plurality of organic EL elements 50.

In this embodiment, the glass substrate 1 corresponds to a substrate; the organic electroluminescent element 50 corresponds to an organic electroluminescent element; the hole injection electrode 2 to a first electrode; the light emitting layer 5 to a light emitting layer; the electron injection electrode 8 to a second electrode; the metal thin film 81 to a metal film; the metal oxide film 82 to a metal oxide film; and the protection film 9 to a passivation layer. Further, the organic electroluminescent device 100 corresponds to an organic electroluminescent device; the sealing agent 10 to an adhesive layer; the sealing plate 20 to a sealing plate; and the color filter 21 and the CCM to a color conversion member.

The layers from the hole injection electrode 2 to the electron injection electrode 8 may be stacked on the glass substrate 1 in a reverse order to that of this embodiment, with the hole injection electrode 2 having electrical conductivity and optical transparency. In that case, the electron injection electrode 8 corresponds to a first electrode, while the hole injection electrode 2 corresponds to a second electrode.

Note that in the organic electroluminescent device according to the present invention and the fabrication method thereof, the structure of the organic EL element as well as the structures of the sealing agent and the sealing plate shall not be restricted to those as in this embodiment.

EXAMPLES

In Inventive Examples 1-3 and Comparative Examples 1-3, single organic EL elements were formed on substrates using different resin adhesives as sealing agents, followed by sealing of the organic EL elements according to the method as described in the above embodiment.

Inventive Examples 1-3 and Comparative Examples 1-3

Figure 2:
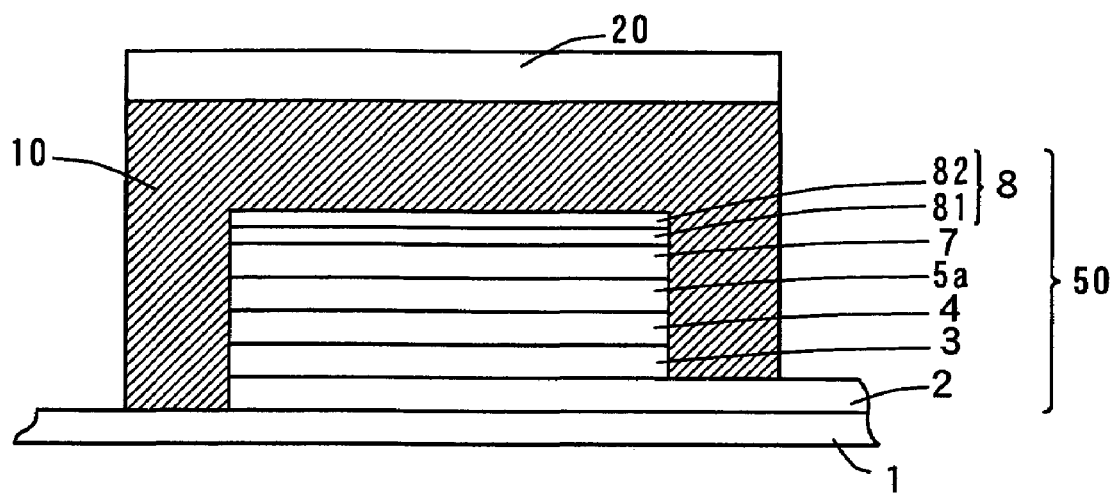
FIG. 2 is a schematic cross-section showing the sealed structure of each of organic EL elements according to Inventive Examples 1-3 and Comparative Examples 1-3.

FIG. 2 is a schematic cross-section showing the sealed structure of each of the organic EL elements according to Inventive Examples 1-3 and Comparative Examples 1-3.

For the organic EL elements according to Inventive Examples 1-3 and Comparative Examples 1-3, sealing was done in the method as described in the above embodiment.

As shown in FIG. 2, a single organic EL element 50 is formed on a substrate 1. The organic EL element 50 on the substrate 1 is covered with a sealing agent 10, of which the upper surface is bonded to a sealing plate 20.

First, the organic EL element 50 was formed on the substrate 1. A glass substrate was used as the substrate 1.

The organic EL element 50 has a stacked layer structure of a hole injection electrode 2, a hole injection layer 3, a hole transport layer 4, an electron transporting light emitting layer 5a, an electron injection layer 7, and an electron injection electrode 8.

As the hole injection electrode 2, Ag was employed, while as the hole injection layer, CuPc (copper phthalocyanine) was employed. As the hole transport layer 4, N,N'-Di(1-naphthyl)-N,N'-diphenyl-benzidine (abbreviated to NPB) was employed.

As the electron transporting light emitting layer 5a, Tris (8-hydroxyquinolinato)aluminum (abbreviated to Alq3) was employed. As the electron injection layer 7, lithium fluoride (LiF) was employed.

As a metal thin film 81, Ag having a thickness of 20 nm was employed. As a metal oxide film 82, IZO having a thickness of 100 nm was employed. A glass was employed as the sealing plate 20.

After this, the sealing plate 20 and the substrate 1 bearing the organic EL element 50 were positioned so as to oppose each other, followed by lamination with a given pressure. Lastly, the sealing agent 10 between the substrate 1 and the sealing plate 20 was cured by ultraviolet irradiation, so that sealing of the organic EL element 50 was completed.

In Inventive Examples 1-3 and Comparative Examples 1, 2, UV-curing type epoxy resin adhesives having different pHs were used, while in Comparative Example 3, a UV-curing type acrylic resin adhesive was used.

The resin adhesives used in Inventive Examples 1, 2 and Comparative Examples 1, 2, have a light transmittance of 91% on average in the wavelength range of 450 nm to 800 nm, with the variation range of the light transmittance in the wavelength range of 450 nm to 800 nm being in a range of +0.6% to −1.6% for the average light transmittance. The resin adhesive used in Example 3, on the other hand, has a light transmittance of 74% on average in the wavelength range of 450 nm to 800 nm, with the variation range of the light transmittance in the wavelength range of 450 nm to 800 nm being in a range of +4.5% to −16% for the average light transmittance.

The resin adhesives used in Inventive Examples 1, 2 and Comparative Examples 1, 2 were not colored, being transparent through eyesight. The resin adhesive in Example 3 assumed yellowish color, although being transparent through eyesight.

The pH measurement method for the resin adhesives used in Inventive Examples 1-3 and Comparative Examples 1-3 will now be described.

First, a resin adhesive for use as the sealing agent was applied on 1737 glass substrate manufactured by Corning Incorporated, followed by curing of the resin adhesive under given curing conditions. After curing, the resin adhesive was extracted from the glass substrate. The extracted resin adhesive was frost-shattered using 6700 Freezer/Mill manufactured by SPEX.

First, the resin adhesive was frost-shattered for two minutes with an interval (standing time) of two minutes, and again frost-shattered for one minute with an interval of two minutes. Note that this frost-shattering time was altered when the resin adhesive was judged not to be sufficiently shattered.

From the shattered resin adhesive, a resin adhesive corresponding to 42 to 100 meshes was extracted using a sieve, and subjected to pure pressure extraction at 120° C. for 48 hours. The extracted resin adhesive was measured for pH. For the pH measurement, Castany-ACT pH meter (D-13), manufactured by HORIBA Limited, was used. As for calibration, the three-point calibration was performed (standard buffer solutions with pHs of 4.0, 6.86 and 9.18, manufactured by Wako Pure Chemical Industries Limited).

The results of the pH measurements for the resin adhesives in Inventive Examples 1-3 and Comparative Examples 1-3 are given in Table 1.

TABLE 1

| | Material | pH |
|---|---|---|
| Inventive Example 1 | UV-curing type epoxy resin | 5.42 |
| Inventive Example 2 | UV-curing type epoxy resin | 4.08 |
| Inventive Example 3 | UV-curing type epoxy resin | 5.50 |
| Comparative Example 1 | UV-curing type epoxy resin | 3.07 |
| Comparative Example 2 | UV-curing type epoxy resin | 2.70 |
| Comparative Example 3 | UV-curing type acrylic resin | 3.50 |

For the organic EL elements 50 that were sealed in the above Inventive Examples 1-3 and Comparative Examples 1-3, high temperature and high humidity tests were conducted in the following method. During the high temperature and high humidity tests, the sealed organic EL elements 50 were allowed to stand in an environment of a temperature of 85° C. and a humidity of 85%, so as to measure with an elapse of time the spread of non-luminescent regions from the edges of their hole injection electrodes 2.

Figure 3:
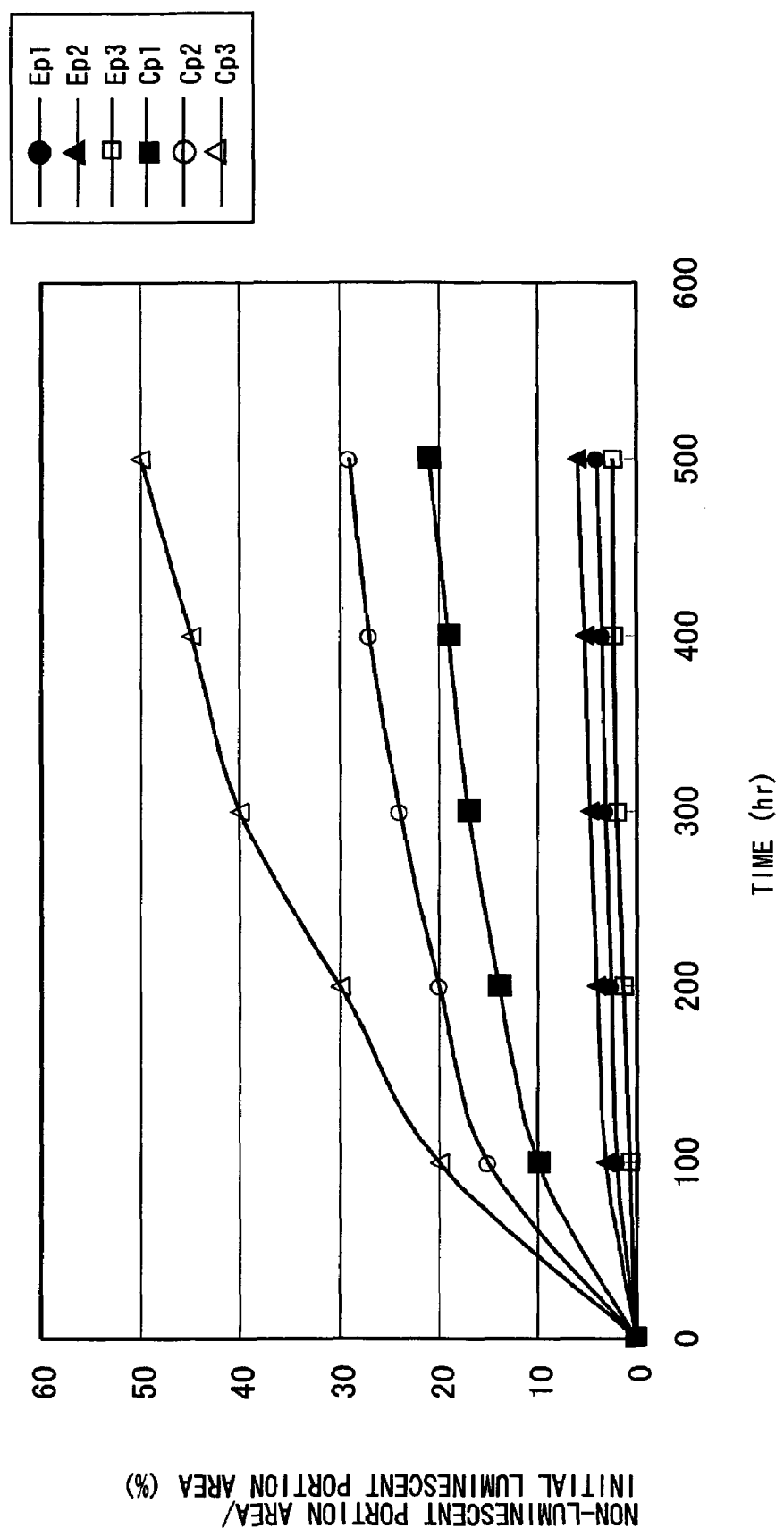
FIG. 3 is a graph showing the results of high temperature, high humidity tests for the organic EL elements sealed in Inventive Examples 1-3 and Comparative Examples 1-3.

FIG. 3 is a graph showing the results of the high temperature and high humidity tests for the organic EL elements 50 sealed in Inventive Examples 1-3 and Comparative Examples 1-3.

FIG. 3 shows that in the organic EL element 50 sealed in Comparative Example 1, as indicated by the curve Cp1, the proportion of its non-luminescent portion to its initial luminescent portion increased with an elapse of time, being about 22% during the luminescence after stood for 500 hours.

In the organic EL element 50 sealed in Comparative Example 2, the curve Cp2 shows that the proportion of its non-luminescent portion to its initial luminescent portion increased with an elapse of time, being about 28% during the luminescence after stood for 500 hours.

In the organic EL element 50 sealed in Comparative Example 3, the curve Cp3 shows that the proportion of its non-luminescent portion to its initial luminescent portion increased with an elapse of time, being about 50% during the luminescence after stood for 500 hours.

On the other hand, in the organic EL element 50 sealed in Example 1, the curve Ep1 shows that the proportion of its non-luminescent portion to its initial luminescent portion increased little with an elapse of time, being not more than about 5% during the luminescence after stood for 500 hours. It was thus found that the formation and expansion of the non-luminescent region was suppressed.

Moreover, in the organic EL element 50 sealed in Example 2, the curve Ep2 shows that the proportion of its non-luminescent portion to its initial luminescent portion increased little with an elapse of time, being not more than about 5% during the luminescence after stood for 500 hours. It was thus found that the formation and expansion of the non-luminescent region was suppressed.

Further, in the organic EL element 50 sealed in Example 3, the curve Ep3 shows that the proportion of its non-luminescent portion to its initial luminescent portion increased little with an elapse of time, being not more than about 5% during the luminescence after stood for 500 hours. It was thus found that the formation and expansion of the non-luminescent region was suppressed.

As described above, the organic EL element 50 in Example 3, although having similar moisture resistance to that of the organic EL element 50 in Example 1, has a transmittance of 70% or less for the resin adhesive and also assumes yellowish color, which caused a decrease in its luminous efficiency. As for the organic EL elements in Inventive Examples 1, 2, on the other hand, the luminous efficiencies were not decreased because of the transmittance for the resin adhesives being 90% or more.

The results shown in FIG. 3 confirmed that the use of a resin adhesive having a pH not less than four nor more than ten as the sealing agent may suppress a significant increase of non-luminescent region.

When, on the other hand, a resin adhesive having a pH lower than four was used as the sealing agent, significantly increased non-luminescent region and the formation of dark spots were confirmed. This may be attributed to the corrosion of the metal thin film 81 due to the invasion of an acid solution through defects on the metal thin film 81, with the electron injection electrode 8 including the 20 nm thick metal thin film 81.

In the above Examples, the sealing plate 20 and the substrate 1 were laminated in the atmosphere; but as an alternative, the sealing plate 20 and the substrate 1 may be laminated in a reduced-pressure atmosphere or under vacuum. Moreover, in the above Examples, the sealing plate 20 and the substrate 1 were laminated with a given pressure; but as an alternative, a desired thickness obtained when the sealing plate 20 and the substrate 1 are laminated may be predetermined, using a method for laminating the sealing plate 20 and the substrate 1 in such a way as to achieve the desired thickness.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An organic electroluminescent device comprising:
   a substrate;
   one or more organic electroluminescent elements provided on said substrate; and
   an adhesive layer composed of an adhesive that is provided on said one or more organic electroluminescent elements, wherein
   each of said one or more organic electroluminescent elements includes a first electrode, a light emitting layer, and a second electrode in this order on said substrate,
   said second electrode has a stacked layer structure of a metal oxide film and a metal film having a smaller thickness than that of said metal oxide film, and
   a solution extracted from the adhesive of said adhesive layer has a pH of not less than four.

2. The organic electroluminescent device according to claim 1, wherein
   said metal film of said second electrode has a thickness not less than 1 nm nor more than 20 nm.

3. The organic electroluminescent device according to claim 1, wherein
   said adhesive layer has a light transmittance of not less than 70% on average in the wavelength range of 450 nm to 800 nm.

4. The organic electroluminescent device according to claim 1, wherein
   the variation range of the light transmittance of said adhesive layer in the wavelength range of 450 nm to 800 nm is not more than ±10% for the average light transmittance.

5. The organic electroluminescent device according to claim 4, wherein
   the variation range of the light transmittance of said adhesive layer in the wavelength range of 450 nm to 800 nm is not more than ±5% for the average light transmittance.

6. The organic electroluminescent device according to claim 1, further comprising an optically transparent sealing plate that is provided on said adhesive layer.

7. The organic electroluminescent device according to claim 6, further comprising a color conversion member that is provided on said sealing plate.

8. The organic electroluminescent device according to claim 1, wherein
   said sealing plate is composed of a glass.

9. The organic electroluminescent device according to claim 1, wherein
   each of said one or more organic electroluminescent elements further comprises a passivation layer that is provided on said second electrode.

10. The organic electroluminescent device according to claim 1, wherein
    said substrate is either a passive type substrate or an active matrix type substrate having a plurality of thin film transistors.

11. The organic electroluminescent device according to claim 1, wherein
    a filler is added to said adhesive layer.

12. An organic electroluminescent device comprising:
a substrate;
one or more organic electroluminescent elements provided on said substrate;
an adhesive layer composed of an adhesive that is provided on said one or more organic electroluminescent elements; and
an optically transparent sealing plate that is provided on said adhesive layer, wherein
each of said one or more organic electroluminescent elements includes a first electrode, a light emitting layer, and an optically transparent second electrode in this order on said substrate, and
a solution extracted from the adhesive of said adhesive layer has a pH of not less than four.

13. The organic electroluminescent device according to claim 12, wherein
said adhesive layer has a light transmittance of not less than 70% on average in the wavelength range of 450 nm to 800 nm.

14. The organic electroluminescent device according to claim 13, wherein
the variation range of the light transmittance of said adhesive layer in the wavelength range of 450 nm to 800 nm is not more than ±10% for the average light transmittance.

15. The organic electroluminescent device according to claim 14, wherein
the variation range of the light transmittance of said adhesive layer in the wavelength range of 450 nm to 800 nm is not more than ±5% for the average light transmittance.

16. The organic electroluminescent device according to claim 12, wherein
said sealing plate is composed of a glass.

17. The organic electroluminescent device according to claim 16, further comprising a color conversion member that is provided on said sealing plate.

* * * * *